United States Patent [19]

Yotsumoto et al.

[11] Patent Number: 4,604,643
[45] Date of Patent: Aug. 5, 1986

[54] SEMICONDUCTOR RECTIFIER DEVICE

[75] Inventors: Yoshiharu Yotsumoto, Tokyo; Katsuhiko Kubota, Yokohama; Toshinobu Sekiba, Kawasaki, all of Japan

[73] Assignee: Tokyo Shibaura Denki Kabushiki Kaisha, Japan

[21] Appl. No.: 665,509

[22] Filed: Oct. 30, 1984

Related U.S. Application Data

[63] Continuation of Ser. No. 298,741, Sep. 2, 1981.

[30] Foreign Application Priority Data

Sep. 4, 1980 [JP] Japan ............... 55-122660

[51] Int. Cl.4 ............ H01L 23/48; H01L 25/02; H01L 27/02
[52] U.S. Cl. ............................. 357/75; 357/76; 357/81
[58] Field of Search ............... 357/81, 76, 75

[56] References Cited

U.S. PATENT DOCUMENTS

| 3,486,083 | 12/1969 | Takada | 357/81 |
|---|---|---|---|
| 3,777,193 | 12/1973 | Buehner | 357/76 |
| 3,789,275 | 1/1974 | Sawano et al. | 357/81 |
| 3,820,153 | 6/1974 | Quinn | 357/75 |
| 3,925,809 | 12/1975 | Striker | 357/81 |
| 4,069,497 | 1/1978 | Steidlite | 357/81 |
| 4,218,694 | 8/1980 | Grzybowski | 357/76 |
| 4,259,061 | 3/1981 | Dubetsky | 357/13 |
| 4,305,088 | 12/1981 | Narita et al. | 357/79 |
| 4,320,251 | 3/1982 | Narisimhan | 357/30 |
| 4,392,151 | 7/1983 | Iwatani | 357/81 |

OTHER PUBLICATIONS

M. Yamauchi et al., "Arc Plasma Sprayed Electrical Circuits and Sputtering Targets", 10 *J. Spray Coating Soc'y of Japan*, 2:23 (1973).

Primary Examiner—Martin H. Edlow
Assistant Examiner—Jerome Jackson
Attorney, Agent, or Firm—Finnegan, Henderson, Farabow, Garrett & Dunner

[57] ABSTRACT

A semiconductor rectifier device includes a heat-radiating substrate, a flame-sprayed insulating layer formed directly on a surface of the substrate, at least one first flame-sprayed metal layer selectively formed on the surface of the radiation substrate, and a second metal layer selectively formed on the flame-sprayed insulating layer. A rectifying circuit has first and second rectifying elements which are electrically coupled, respectively, at terminals of opposite polarities, with the first flame-sprayed metal layer and the second flame-sprayed metal layer. An electrode electrically connects the terminals of the rectifying elements having polarities opposite to those of the terminals connected to the first and second flame-sprayed layers.

12 Claims, 14 Drawing Figures

F I G. 9A 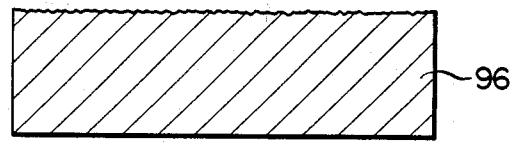
F I G. 9B 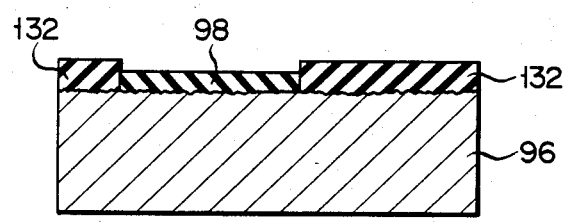
F I G. 9C 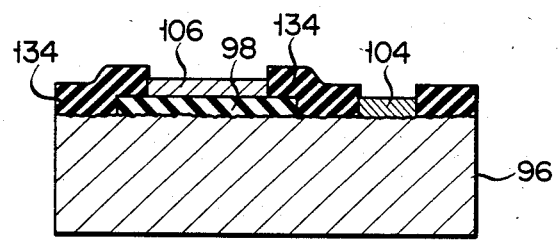
F I G. 9D 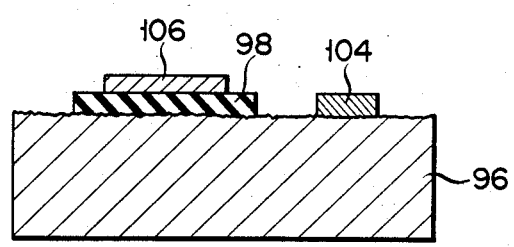

SEMICONDUCTOR RECTIFIER DEVICE

This application is a continuation of application Ser. No. 298,741, filed Sept. 2, 1981.

BACKGROUND OF THE INVENTION

The present invention relates to a semiconductor rectifier device used in combination with a generator for vehicles.

Generally, a generator for charging a vehicle battery, such as an automobile battery, is carried on the vehicle itself. An alternator is usually used for this type of generator. An AC voltage generated by the alternator is rectified by a rectifier circuit for example by circuit 12 shown in FIG. 1. FIG. 1 illustrates a circuit arrangement of the rectifier circuit 12 coupled with the alternator 14. Stator coils, designated by numerals 16, 18 and 20, are star-connected to one another. Three pairs of diodes 22a and 22b, 24a and 24b, and 26a and 26b constitute a full-wave rectifier for full-wave rectifying an AC voltage generated by the alternator 14. Junction points of those pairs of the diodes 22a and 22b, 24a and 24b, and 26a and 26b are respectively connected to the ends of the stator coils 16, 18 and 20. The cathodes of the diodes 22a, 24a and 26a are commonly connected to a positive terminal of a battery 28, while the anodes of the diodes 22b, 24b and 26b are commonly connected to a negative terminal of the battery 28. With this circuit arrangement, the power generated by the alternator used to charge battery 28.

FIG. 2 illustrates in cross section an actual rectifier device of the prior art which incorporates the circuit arrangement shown in FIG. 1. In FIG. 2, reference numeral 32 designates a casing; numeral 34 a stator; numeral 38 a fan which rotates with the rotation of an engine and cools the inside of the casing 32. Provided within the casing 32 is a semiconductor rectifier device 40 having the diodes 22a, 22b, 24a, 24b, 26a and 26b, constructed as shown in FIGS. 3 to 5 to which attention is further invited. The semiconductor rectifier device 40 is generally called a rectifier assembly (hereinafter referred to as "RA").

The RA 40 is provided with a couple of electrode guide plates 42 and 44 facing each other with an array of the diodes 22a to 26b interposed therebetween. The electrode guide plates 42 and 44 are illustrated in plan view in FIGS. 3 and 4, respectively. Those plates 42 and 44 are fixedly coupled with each other, so that the surfaces illustrated are in tight contact with each other.

FIG. 5 shows a cross sectional view of the electrode guide plate assembly when the pair of electrode guide plates 42 and 44 have been coupled together taken on line V—V and viewed in the direction of arrows in FIGS. 3 and 4. The electrode guide plate 42 (FIG. 3) includes two electrode guide members 46 and 48, serving also as a radiator, which are arranged in a horseshoe shape. An insulating member 50, made of thermosetting plastic material such as epoxy resin, mechanically fixes together and electrically insulates the coupled electrode guide plates 42 and 44 from each other. The electrode guide plate 44 (FIG. 4) includes electrode guide members 52, 54 and 56, which are arranged in a horseshoe shape, so as to be aligned with the horseshoe arrangement of electrode guide members 46 and 48 of the guide plate 42 when the plates 42 and 44 are coupled with each other. The insulating member 50 is also used in the guide plate 44 for electrically insulating and mechanically fixedly positioning those members 52, 54 and 56.

The electrode guide member 46 has three concave portions 60a, 60b and 60c and the guide member 48 has also three concave portions 62a, 62b and 62c. In those concave portions, diodes 22a, 22b, 24a, 24b, 26a and 26b are disposed, as shown. The electrode guide members 52, 54 and 56 are provided with input terminals 64, 66 and 68 each coupled with the one end of each stator coil 16, 18 or 20 (FIG. 1) of the alternator 14. The electrode guide members 46 and 48 are provided with DC output terminals 70 and 72 for correction with positive and negative terminals of the battery 28. The insulating member 50 is used to assemble the electrode guide plates 42 and 44 together and to seal the diodes 22a, to 26b disposed in the concave portions 60a to 62c, and forms a layer between the guide plates 42 and 44 when those are coupled, with the result that those plates are mechanically fixed to each other but are electrically insulated from each other. As the insulating member 50, a pre-impregnated material is generally used which comprises glass fibers impregnated with epoxy resin.

The RA thus constructed has a low thermal conductivity of the insulating member 50 between the guide plates 42 and 44. Therefore, the heat radiation of the whole RA 40 is low. For this reason, the prior art RA employs a cooling means shown as a space provided between the casing 32 and the semiconductor device 40 (FIG. 2) for allowing the flow of cool air therethrough. Further, to improve the radiation efficiency, an enlarged radiation area must be provided.

Therefore, the outer configuration of the prior art RA is horizontally expanded to 50 cm$^2$. Because of this expansion, the weight is also increased to approximately 133 g, i.e. relatively heavy. The increased size frequently affects adversely the flow of the cooling air into the device. As shown in FIG. 2, a part of the electrode guide member 46 is directly mounted to the casing 32, but the other guide member 48 must be electrically insulated from the casing 32, resulting in poor thermal conductivity. Consequently, the thermal resistance of the whole RA is approximately 7° C./W, causing considerable temperature rise.

In order to make the radiation efficiencies of the electrode guiding plates 42 and 44 equal to each other, the surface area of the guide member 48 insulated from the casing 32 must be larger than that of the guide member 46. In designing the RA, this must be taken into account.

To solve this problem, the present inventors developed an RA now part of the prior art as shown in FIG. 6. As shown, a metal layer 86 made of copper, for example, is thermally bonded to one surface of a substrate 82 made of copper, for example. The other surface of substrate 32 is tightly connected to the casing 32 of the alternator. The insulative member 84, made of glass epoxy or polyimide resin, is interposed between layer 86 and substrate 82. A diode 88 is fixed at the anode to the substrate 82 by means of soldering. Another diode 90 is connected at the cathode to the copper layer 86. The cathode of the diode 88 and the anode of the diode 90 are commonly connected by an electrode plate 92. Three combinations each having diodes 88 and 90 and the electrode 92 are formed on the same substrate 82. The electrodes of those combination are each connected to one end of each stator coil 16, 18 or 20.

The RA thus constructed is supplied with a DC voltage of which the negative polarity is coupled with the substrate 82 and the positive polarity is coupled with the metal layer 86. The RA is light in weight and small in size. Further, since the substrate 82 is fixed to the casing of the alternator, and is thus in close contact therewith, the heat radiation efficiency is relatively high. In the RA, an insulating resin such as glass epoxy or polyimide is interposed between the metal layer 86 and the substrate 82 as mentioned above. Because of the use of the insulating resin, there is a limit in decreasing the thermal resistance. Therefore, a temperature difference is caused between the diodes 88 and 90, and it was 10° C. or more according to an experiment which was conducted.

SUMMARY OF THE INVENTION

Accordingly, an object of the present invention is to provide a semiconductor rectifier device (RA) which is small in size, light in weight and high in the heat radiation effeciency.

According to the present invention, there is provided a semiconductor rectifier device (RA) comprising: a substrate designed to radiate heat; a flame-sprayed insulating layer formed directly on a surface of said substrate, having a thickness of substantially 50 to 150 microns and having a low heat resistance; at least one first flame-sprayed metal layer formed directly on said surface of said substrate; a second flame-sprayed metal layer formed on said flame-sprayed insulating layer; a rectifying circuit including first and second rectifying elements which are each electrically coupled at one of their terminals with said first flame-sprayed metal layer and said second flame-sprayed metal layer respectively, the terminals so coupled being of opposite polarity; and electrode members for electrically connecting the terminals of said rectifying elements having polarities opposite to those of said terminals connected to said first and second flame-sprayed layers.

BRIEF DESCRIPTION OF THE DRAWINGS

Other objects and features of the present invention will be apparent from the following description taken in connection with the accompanying drawings, in which:

FIGS. 9A to 9D illustrate a sequence of process steps for manufacturing the substrate arrangement shown in FIG. 8.

DETAILED DESCRIPTION OF THE PREFERRED EMBODIMENTS

A preferred embodiment of a semiconductor rectifier device (RA) according to the present invention will be described referring to the accompanying drawings.

Figure 7:
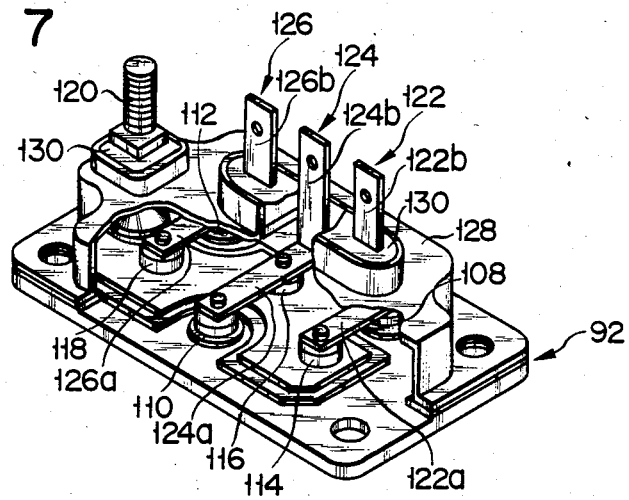
FIG. 7 is a perspective view of an embodiment of an RA according to the present invention.

Referring now to FIG. 7, there is shown an embodiment of an RA according to the present invention. A heat radiating substrate arrangement 92 of the RA shown in FIG. 7 is solely illustrated in FIG. 8, for a better understanding of the present invention.

Figure 8:
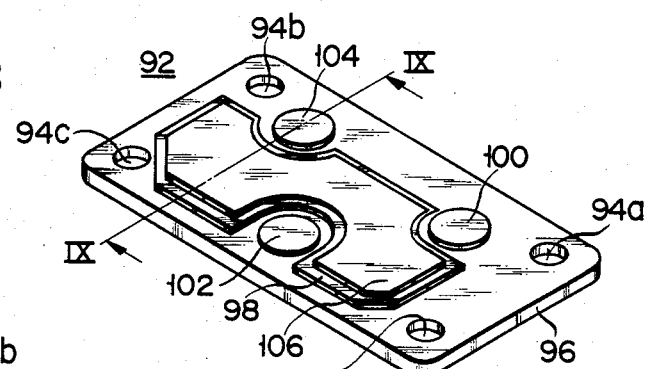
FIG. 8 is a perspective view of a substrate arrangement of the RA in FIG. 7.

The construction of the radiator substrate arrangement 92 will first be given referring to FIG. 8. In the substrate arrangement, a substrate member 96, made of aluminum Al of 2 mm in thickness has four screw holes 94a to 94d formed at the corners thereof through which the substrate member 96 is fixedly mounted onto the casing of the alternator. A flame-sprayed insulating layer 98, made of ceramic such as aluminum oxide (Al$_2$O$_3$) or silicon dioxide (SiO$_2$) and having a thickness ranging from 50 to 150 μm, for example, is selectively formed on the substrate member 96 by a flame spraying technique, for example, a plasma flame spraying technique. First flame-sprayed metal layers 100, 102 and 104, made of, for example, copper and having a thickness ranging from 50 to 150 μm, for example, is selectively formed on the substrate member 96 by the plasma flame spraying technique, for example. A second flame-sprayed metal layer 106, made of, for example, copper and having a thickness from 50 to 150 μm, is selectively formed on the flame-sprayed insulating material 98 by the flame spraying technique.

Various necessary components are mounted on the substrate arrangement 92 thus constructed, as shown in FIG. 7, thereby forming an RA according to the present invention. As shown, three diodes 108, 110 and 112 are soldered on the first flame sprayed metal layers 100, 102 and 104, with the anodes facing toward the layers. Three diodes 114, 116 and 118 are soldered in place on the second flame sprayed metal layer 106, with the cathodes facing toward the layer 106. Further soldered to the second metal layer is one end of a bar electrode 120. The cathode of the diode 108 and the anode of the diode 114 are soldered to a horizontal portion 122a of an L-shaped electrode plate 122, thereby being electrically connected to each other. Similarly, the cathode of the diode 110 and the anode of the diode 116 are soldered to a horizontal portion 124a of an L-shaped electrode plate 124, thereby being electrically connected to each other. Further, the cathode of the diode 112 and the anode of the diode 118 are soldered to a horizontal portion 126a of an L-shaped electrode plate 126, thereby setting up an electric connection therebetween.

In order to protect the bar electrode 120 and the L-shaped electrodes 122, 124 and 126 from an external mechanical force applied thereto, a covering member 128 made of rigid material such as aluminum is fixed to the substrate member 96 by using a resin member for the thermal bonding such as glass epoxy or polyimide. Vertical portions 122b, 124b and 126b of the L-shaped electrode plates 122, 124 and 126, and the bar electrode 120 are outwardly extended beyond the covering member 128. Gaps between the bar electrode 120 and the L-shaped electrode plates 122, 124 and 126 and the covering member 128 are filled with insulative resin member 130 and hermetically sealed.

Figure 1:
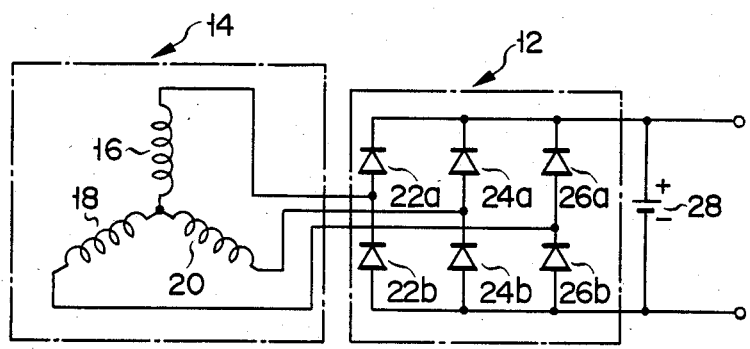
FIG. 1 is a conventional circuit diagram of a rectifier circuit coupled with an alternator.
Figure 2:
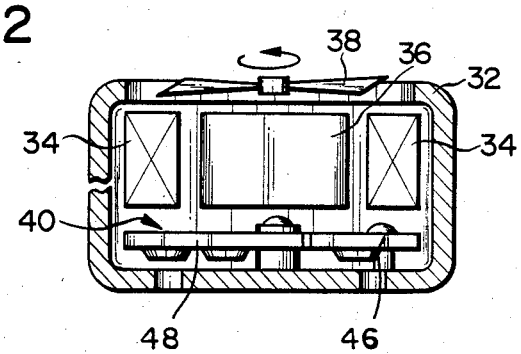
FIG. 2 is a cross sectional view of a conventional alternator-rectifier assembly with a circuit arrangement as shown in FIG. 1.
Figure 3:
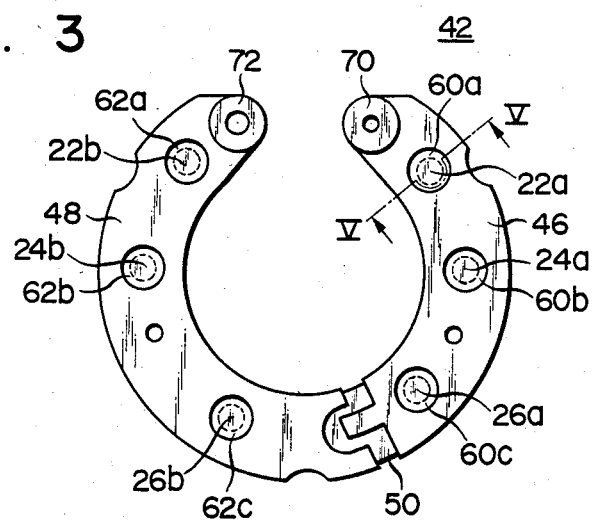
FIGS. 3 and 4 are plan views of a rectifier device used in the assembly of FIG. 2.
Figure 4:
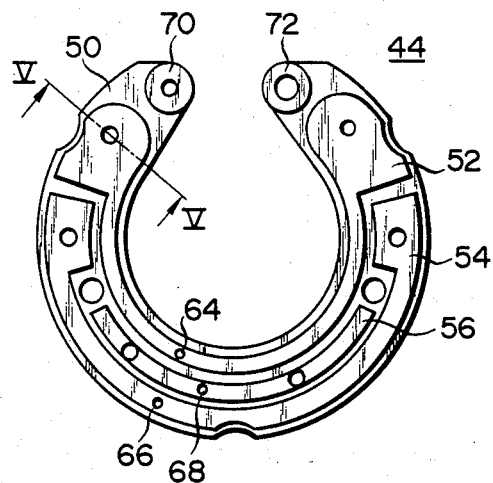
Figure 5:
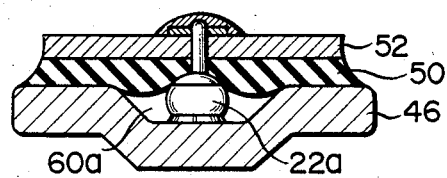
FIG. 5 is a cross sectional view taken on line V—V in FIGS. 3 and 4.
Figure 6:
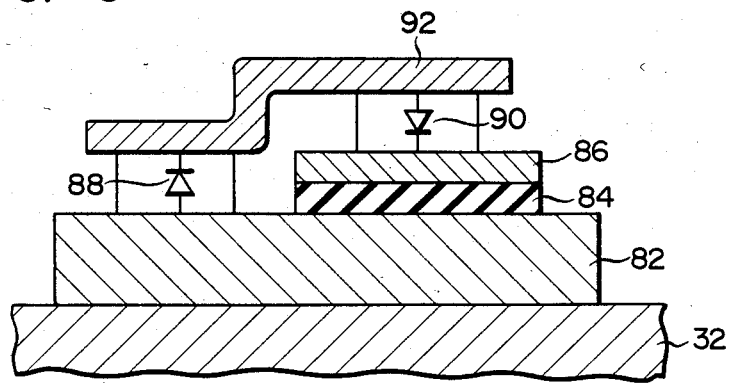
FIG. 6 is a cross sectional view of another semiconductor rectifier device of the prior art.

When the semiconductor rectifier device thus constructed is mounted to the casing 32 as shown in FIG. 2 and is connected to the alternator 14 as shown in FIG. 1, the substrate member 96 is fixed to the inside or the outside of the casing 32, in close contact with the latter. The vertical portions 122b, 124b and 126b of the L-shaped electrode plates 122, 124 and 126 are each connected to the one end of each stator coil 16, 18 or 20 of the alternator 14. The bar electrode 120 is connected to the positive terminal of the battery 28 (FIG. 1).

In the semiconductor device with such a construction, the insulating layer 98, the first metal layers 100, 102, and 104, and the second metal layer 106 are formed by the flame spraying technique. Therefore, the thermal conductivity in the connection part among those components is high, so that there is no need of the provision of the cooling means. This allows the substrate member 96 to be fixed to the casing 32 in close contact. This close contact of the substrate member 96 to the casing reduces the thermal resistance and it was 6.4° C./W according to an experiment.

Further, in the present embodiment, the substrate member 96 is fixed to the casing 32 with close contact therebetween, thereby dissipating heat well through a large surface of the casing 32. Because of this feature, there is no need for the provision of a large surface area of the substrate member for the purpose of cooling. The horizontally expanded area of the substrate of the prior art can be reduced. For example, the mounting area of the substrate to the casing 32 could be reduced to 24 cm$^2$, which would also decrease the weight of the rectifier device to 44 g, also by way of example.

In the manufacturing process, when the flame-sprayed layers 98, 100, 102 and 104, and the like are formed on the surface of the substrate member 96 in a later step, the surface of the substrate member is subjected to a blast treatment, for example, a sand blast treatment. When this occurs, the surface of the substrate member which has been so treated expands so that the substrate member tends to warp by about 0.1 mm. The amount of warp of the substrate member 96 is reduced to approximately 0.03 mm after it is thermally bonded onto the covering member 128 by using a proper resin member. However, when the temperature of the device returns to a normal temperature after the heat-treatment, the substrate member 96 tends to be again warped to its original degree of warp. In this case, when the covering member 128 is made of non-rigid material, the recovery of the warp can not be checked, and therefore, the covering member 128 tends to deform due to the warp. The present embodiment, however, is free from such deformation, because the covering member 128 is made of a highly rigid material. Therefore, there is no need of an additional application of the blast treatment for the non-warped surface of the substrate member 96. As a result, the manufacturing process of the semiconductor rectifier device is simplified.

For mounting the substrate arrangement 92 on the casing 32, the four holes 94a, 94b, 94c and 94d of the substrate member 96 are aligned with corresponding holes formed at the corners of the covering member 128, and the substrate member 96 is placed in close contact with the casing 32. Screws are inserted into those aligned holes from the covering member 96 side and screwed into the casing. Generally, an automobile is used under various environments and the engine of the automobile is driven under various conditions. Temperature of the engine may vary, in an extreme case, from a about −50° C. to about +50° C. according to the driving conditions. In this case, the temperature of the covering member 128 may vary according to the engine temperature. If the covering member 128 is made of plastic material, the member 128 contracts when it cools down to a normal temperature from a high temperature. As a result, gaps are formed between the screws and the covering member 128 due to the creep phenomenon, resulting possibly in a lessening of the the tight fit of the covering member 128 to the casing 32. The present embodiment, however, is free from such a problem, because the material of the substrate member 96 is metal. Therefore, in the present embodiment the substrate member 96 remains tightly fixed to the casing 32.

According to an experiment, a temperature difference between the diodes 108, 110 and 112 disposed on the first flame-sprayed metal layers 100, 102 and 104 and the diodes on the second flame-sprayed metal layer was 5° C. or less.

An example of a manufacturing process of the substrate arrangement shown in FIG. 8 will be described referring to FIGS. 9A to 9D. The diagrams in those figures are each a cross section taken on line IX—IX in FIG. 8 and as viewed in the direction of arrows, and further are depicted exaggeratedly for ease of illustration.

A substrate member 96 made of aluminum Al, for example, is prepared, as shown in FIG. 9. One of the main surfaces of the substrate member 96, for example, the upper surface of the substrate member in this example, is subjected to a blast treatment such as a sand blast treatment, thereby making the surface coarse as shown. As the result of the blast treatment, the substrate member 96 in fact is warped upwardly, as viewed in the drawings, by approximately 0.1 mm. The warp is not depicted for simplicity of illustration, however. The blast treatment determines the bonding strength of the flame sprayed insulating layer 98, and the flame-sprayed metal layers 100, 102 and 104 formed on the coarse surface of the substrate member 96 in a later step. Therefore, the blast condition must be carefully selected. In this example, the coarseness on the surface is selected in a range from 10 to 20 μm.

In the next step, a first mask layer 132 having a given pattern, and made of iron Fe, for example, is formed on the coarse surface. By using the first mask layer 132 so formed, a ceramic such as $Al_2O_3$ is flame-sprayed over the coarse surface of the substrate member 96 to selectively form a flame-sprayed insulating layer 98 of 50 to 150 μm in thickness, as shown in FIG. 9B. Following this step, the first mask 132 is removed and a second mask layer 134 having a given pattern, is formed on the coarse surface. Then, metal such as copper is flame-sprayed over the semiproduct of the substrate arrangement 96 through the second mask layer, thereby selectively forming the first metal layers 100, 102 and 104 of 50 to 150 μm in thickness on the coarse surface and the second metal layer 106 on the flame-sprayed insulating layer 98. In this case, the plasma flame spraying technique is applicable for the flame spraying, as shown in FIG. 9C. In the drawing of FIG. 9C, the other metal layers 100 and 102 are not shown but actually those are formed in the same step. Finally, the second mask 134 is removed from the semiproduct and the substrate arrangement 92 as shown in FIG. 8 is formed, as shown in FIG. 9D.

In the above example, the thickness of each of the first and second flame-sprayed metal layers 100, 102, 104 and 106 is determined depending on a withstand voltage and a bonding strength of the layers to the substrate member 96. When the layers are too thin, the withstnd voltage is too low, and when too thick, the layers tend to peel off from the substrate member 96.

The RA in the above-mentioned embodiment, which is designed for a three phase alternator, is also applicable for a single-phase or a two-phase alternator, for example. For applying this invention to a single-phase alternator there is used, only one of the three combinations of the diodes 108 and 114 and the L-shaped electrode plate 122, the diodes 110 and 116 and the L-shaped electrode plate 124, and the diodes 112 and 118 and the L-shaped electrode 126. For the two-phase alternator, two of those combinations are used.

Figure 10:
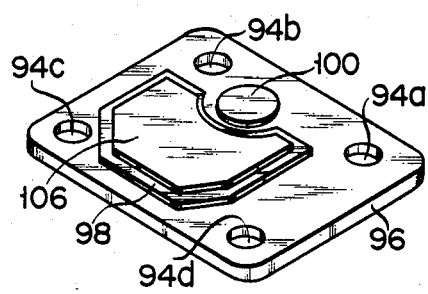
FIGS. 10 and 11 show other examples of the substrate arrangement according to the present invention.
Figure 11:
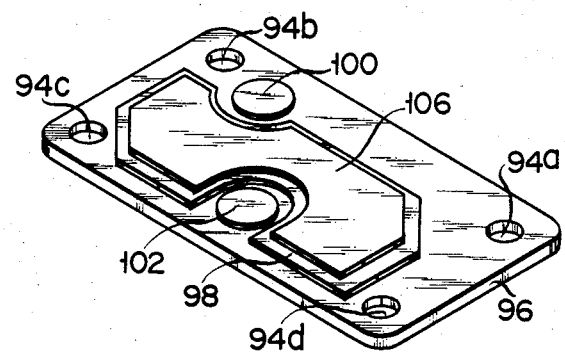

In the single-phase alternator, the substrate arrangement may be modified into an arrangement shown in FIG. 10 in which two diodes and an L-shaped electrode plate are assembled in combination with a single first flame-sprayed metal layer 100. In the two-phase alternator, the substrate arrangement may be constructed such that the combinations, each including two diodes and one L-shaped electrode plate, are assembled in combination with two first flame-sprayed metal layers 100 and 102, respectively, as shown in FIG. 11.

Further, iron Fe may be used in place of aluminum for the substrate member 96 in the above-mentioned embodiment. Copper of the second flame-sprayed metal layer 106 may be replaced by nickel Ni, for example. It is evident that a flame spraying distance, a flame spraying voltage, a flame spraying current, and the like in the flame spraying process are properly selected in accordance with the metal used for the flame spraying.

Having described a specific embodiment of a semiconductor radiation device it is believed that modification and variation of the invention can be made by those skilled in the art in light of the above teachings and without departing from the spirit and scope of this invention as defined by the appended claims and their equivalents.

What we claim is:

1. A semiconductor rectifier device comprising:
a substrate designed to radiate heat;
a flame-sprayed ceramic layer formed directly on a surface of said substrate, and having a low heat resistance;
two first flame-sprayed metal layers formed directly on said surface of said substrate, one of the two metal layers being located at one side of said ceramic layer and the other of the two metal layers being located at the other side of said ceramic layer;
a second flame-sprayed metal layer formed on said flame-sprayed ceramic layer;
a rectifier circuit comprising first through fourth rectifying elements grouped into two pairs, each of said pairs being electrically coupled, respectively, between a separate one of said two first flame-sprayed metal layers and said second flame-sprayed metal layer, each of said rectifying elements having two terminals to permit coupling of the rectifying elements in circuit, wherein the terminals of the rectifying elements in each pair which are coupled to said first and second flame-sprayed metal layers are of opposite polarity; and
an electrode member connected to each pair of rectifying elements at the terminals which are not coupled to said first and second flame-sprayed layers.

2. A semiconductor rectifier device according to claim 1, in which said substrate is made of aluminum.

3. A semiconductor rectifier device according to claim 1, in which said substrate is made of copper.

4. A semiconductor rectifier device according to claim 1, further comprising rigid and non-plastic covering means for protecting said components formed on said substrate.

5. A semiconductor rectifier device according to claim 4, wherein said covering means is bonded to said substrate.

6. A semiconductor rectifier device comprising:
a substrate designed to radiate heat;
a flame-sprayed ceramic layer formed directly on a surface of said substrate, and having a low heat resistance;
first, second and third flame-sprayed metal layers formed directly on said surface of said substrate, said first to third flame-sprayed metal layers being arranged in a staggered fashion with said ceramic layer positioned between them, said first and second flame-sprayed metal layers being located at one side of said ceramic layer and being separated from each other, and said third flame-sprayed metal layer being located at the other side of said ceramic layer;
a fourth flame-sprayed metal layer formed on said ceramic layer;
a rectifier circuit comprising first, second, third, fourth fifth and sixth rectifying elements, the anodes of said first, second and third rectifying elements being electrically coupled to said first, second and third flame-sprayed metal layers, respectively, and the cathodes of said fourth, fifth and sixth rectifying elements being electrically coupled to said fourth flame-sprayed metal layer; and
first, second and third electrode members, said first electrode member being electrically coupled to the cathode of said first rectifying element and the anode of said fourth rectifying element, said second electrode member being electrically coupled to the cathode of said second rectifying element and the anode of said fifth rectifying element, and said third electrode member being electrically coupled to said cathode of said third rectifying element and the anode of said sixth rectifying element.

7. A semiconductor rectifier device comprising:
a substrate designed to radiate heat;
a flame-sprayed ceramic layer formed directly on a surface of said substrate, and having a low heat resistance;
first and second flame-sprayed metal layers formed directly on said surface of said substrate, said first flame-sprayed metal layer being located at one side of said ceramic layer, and said second flame-sprayed metal layer being located at the other side of said ceramic layer;
a third flame-sprayed metal layer formed on said ceramic layer;
a rectifier circuit comprising first, second, third and fourth rectifying elements, the anodes of said first and second rectifying elements being electrically coupled to said first and second flame-sprayed metal layers, respectively, and the cathodes of said third and fourth rectifying elements being electrically coupled to said third flame-sprayed metal layer; and
first and second electrode members, said first electrode member being electrically coupled to the cathode of said first rectifying element and the anode of said third rectifying element, and said second electrode member being electrically coupled to the cathode of said second rectifying element and the anode of said fourth rectifying element.

8. A semiconductor rectifier device comprising:

a substrate designed to radiate heat;

a flame-sprayed ceramic layer formed directly on a surface of said substrate, and having a low heat resistance;

three first flame-sprayed metal layers formed directly on said surface of said substrate, the three metal layers being arranged in a staggered fashion with said ceramic layer positioned between them, two of the three metal layers being located at one side of said ceramic layer and being separated from each other, and the other of the three metal layers being located at the other side of said ceramic layer;

a second flame-sprayed metal layer formed on said flame-sprayed ceramic layer;

a rectifier circuit comprising first through sixth rectifying elements grouped into three pairs, each of said pairs being electrically coupled, respectively, between a separate one of said three first flame-sprayed metal layers and said second flame-sprayed metal layer, each of said rectifying elements having two terminals to permit coupling of the rectifying elements in circuit, wherein the terminals of the rectifying elements in each pair which are coupled to said first and second flame-sprayed metal layers are of opposite polarity; and an electrode member connected to each pair of rectifying elements at the terminals which are not coupled to said first and second flame-sprayed layers.

9. A semiconductor rectifier device according to claim 8, in which said substrate is made of aluminum.

10. A semiconductor rectifier device according to claim 8, in which said substrate is made of copper.

11. A semiconductor rectifier device according to claim 8, further comprising rigid and non-plastic covering means for protecting said components formed on said substrate.

12. A semiconductor rectifier device according to claim 11, wherein said covering means is bonded to said substrate.

* * * * *